United States Patent [19]
Nakato

[11] Patent Number: 5,545,512
[45] Date of Patent: *Aug. 13, 1996

[54] METHOD OF FORMING A PATTERN OF SILYLATED PLANARIZING PHOTORESIST

[75] Inventor: Tatsuo Nakato, Vancouver, Wash.

[73] Assignees: Sharp Microelectronics Technology, Inc., Camas, Wash.; Sharp Kabushiki Kaisha, Osaka, Japan

[*] Notice: The term of this patent shall not extend beyond the expiration date of Pat. No. 5,486,424.

[21] Appl. No.: 437,559

[22] Filed: May 9, 1995

Related U.S. Application Data

[63] Continuation of Ser. No. 154,790, Nov. 12, 1993, abandoned, which is a continuation-in-part of Ser. No. 893,702, Jun. 5, 1992, abandoned.

[51] Int. Cl.$^6$ .................. G03F 7/26; G03C 5/16
[52] U.S. Cl. .............. 430/323; 430/324; 430/327; 430/330
[58] Field of Search .................. 430/323, 324, 430/325, 327, 330

[56] References Cited

U.S. PATENT DOCUMENTS

| | | | |
|---|---|---|---|
| 4,810,601 | 3/1989 | Allen | 430/313 |
| 4,882,008 | 11/1989 | Garza et al. | 156/643 |
| 4,957,588 | 9/1990 | Koshiba et al. | 156/628 |
| 4,963,463 | 10/1990 | Koshiba et al. | 430/191 |
| 5,024,876 | 6/1991 | Bobsein et al. | 428/272 |
| 5,108,875 | 4/1992 | Thackeray | 430/313 |
| 5,286,607 | 2/1994 | Brown | 430/323 |

OTHER PUBLICATIONS

C. Pierrat, et al., Journal of Vacuum Science and Technology, "Positive resist image by dry etching: New dry developed positive working system for electron beam and deep ultraviolet lithography" pp. 1782–1786.

Primary Examiner—Kathleen Duda
Attorney, Agent, or Firm—David C. Ripma; Gerald W. Maliszewski

[57] ABSTRACT

The invention provides an improved planarizing methodology for forming high-definition photolithographic masks of the type used in semiconductor integrated circuit manufacturing. A layer of planarizing photoresist is first applied to the surface topography of a semiconductor wafer substrate and shallow-penetrating radiation is then used to irradiate the surface of the photoresist. The radiation creates a blanket irradiated layer, adjacent the surface of the resist, consisting of an acid and resist in solution. The acid/resist solution readily absorbs and incorporates silicon. Next, the wafer is exposed to a silicon-containing compound, or softbaked in a silicon-containing environment, creating a silicon-enriched region adjacent the surface of the photoresist. An imaging resist is then applied to the resist, and a photolithographic mask is formed in the imaging resist. An etching step transfers the mask to the silicon-enriched region of the photoresist. The remaining areas of the silicon-enriched layer are exposed to an oxygen plasma which converts the silicon-enriched areas to silicon dioxide. The method of the invention produced high-definition mask lines and avoids the defect densities associated with conventional tri-layer processing using SOG.

15 Claims, 2 Drawing Sheets

METHOD OF FORMING A PATTERN OF SILYLATED PLANARIZING PHOTORESIST

This application is continuation of application Ser. No. 08/154,790, filed Nov. 12, 1993, now abandoned, which is a continuation-in-part of application Ser. No. 07/893,702, filed Jun. 5, 1992, now abandoned, entitled "Silylated Photoresist Layer and Planarizing Method," invented by Tatsuo nakato and David E. Vidusek.

BACKGROUND AND SUMMARY OF THE INVENTION

This invention relates to planarizing techniques for use in photolithographic processing of integrated circuits. More particularly, the invention provides a method of forming a desired photolighographic pattern of silylated planarizing resist on an organic planarizing layer to create high-resolution patterns on a substrate.

In a typical integrated circuit device, electronic circuits are fabricated on semiconductor substrates with the components of individual active devices separated by layers of insulation and interconnected via conductive layers. Complex procedures are required to manufacture such circuitry because the surface topography of the substrate must be changed and refined at numerous stages in the process. Adding and removing precisely defined surface features is accomplished using photolithography, which requires the creation of detailed mask patterns which define certain areas that are subsequently removed by chemical etching.

Complex integrated circuits, manufactured to include high density concentrations of electronic components, require the application and removal of numerous photolithographic masks during the processing of the substrate. Creating fine distinctions in surface topography during the latter stages of device manufacturing is particularly difficult. Increasing circuit complexity and miniaturization requires manufacturers to continually develop improved photolithographic methods for creating high definition masks.

One type of photolithographic processing known generally as planarizing employs multilayer resists to achieve the fine definition masks required for Very Large Scale Integration (VLSI) chips having in excess of one hundred thousand components per chip. Planarizing techniques generally involve coating the topography of a semiconductor wafer substrate with a planarizing layer of photoresist and then forming a photolithographic mask in the photoresist using a second or third masking layer.

One planarizing technique used to create high definition masks is termed the bi-layer technique. It uses two layers of photoresist to resolve small geometry's on wafers with varied topographies. Typically, prior art bi-layer planarizing uses two organic layers, a bottom or "planarizing" layer and a top, imaging resist layer in which a mask pattern is created. The two layers have different chemistries, which allows them to be separately etched. The top imaging layer can thus be used as a mask to etch and configure the planarizing layer. A serious limitation of bi-layer planarizing is the need to use planarizing compositions which are sufficiently different from the imaging resist to avoid interfacial mixing. It also requires different irradiation wavelength absorption characteristics in the two layers and different photolithographic processing so the layers can be resolved separately. These factors conspire to limit the planarizing compositions to materials that are much more difficult to process than conventional resists. Consequently, bi-layer planarizing is complex to process, tends to have high defect levels, and is used only for limited, low-volume applications.

Another prior art planarizing technique which improves upon the bi-layer process is referred to as tri-layer planarizing. The tri-layer process incorporates a "hard" layer between the two resist layers of the bi-layer process. The hard layer, in most prior art applications, is a deposited layer of silicon dioxide or other developer-resistant material. Essentially, the tri-layer system deposits a bottom planarizing layer on the substrate topography, then deposits the "hard" layer on the planarizing layer, and finally deposits an imaging resist on the hard layer. The patterned image is formed on the top imaging resist, which is subsequently etched into the hard layer and finally into the planarizing resist. Use of the hard layer simplifies photolithographic processing because it separates the two resist layers and allows each to be processed separately, using similar or identical etch chemistries.

The disadvantage of prior art tri-layer planarizing processes is that the hard layer is difficult to work with. A typical hard planarizing layer used in prior art systems is spin-on-glass ("SOG"). The "glass" is a mixture of silicon dioxide and a solvent that evaporates quickly. After the planarizing resist layer is deposited, the SOG is spun onto the planarizing layer and the glass film is heated to help evaporate the solvent. The result, ideally, is a layer of silicon dioxide film. Unfortunately, the SOG technique produces high defect densities due to particulate formation and deposition during the evaporation of the isopropyl alcohol ("IPA") solvent used in SOG. One mechanism which causes defects is the agglomeration of silicon dioxide into particles in the silicon dioxide-IPA mixture itself. Particles also form during the spin-on application procedure since the IPA evaporates rapidly and can leave encrusted particles of silicon dioxide at the tips of the dispense lines. By whatever method, defect-causing particles tend to be formed and deposited as part of the SOG layer. Despite its deficiencies, the tri-layer technique is an improvement over the bi-layer methodology due to the ease of etching the SOG and planarizing layers with a single step. Tri-layer planarizing tends to produce a highly accurate photolithographic pattern in the planarizing layer.

Yet another prior art planarizing technique involves the incorporation of silicon into selected areas of the planarizing photoresist to create a pattern of "hard" surface regions on the resist. One such technique is disclosed in U.S. Pat. No. 4,882,008. In that patent one or more layers of resist are applied to the substrate. An imaging resist is then applied, defining a photolithographic pattern on its surface. The resist is then exposed to radiation and then to a gaseous silicon-containing species such as hexamethyldisilazane. Silicon is thereby incorporated into the irradiated regions of the resist. The silicon-enriched regions are subsequently exposed to an oxygen plasma which converts the silicon to silicon dioxide. The result is a pattern of silicon dioxide formed in the planarizing photoresist adjacent the surface of the resist. The silicon dioxide serves as a "hard" mask for subsequent photolithographic processing of the photoresist. A similar process is discussed in U.S. Pat. No. 4,963,463, which discloses a photoresist resin composition which forms an acid when exposed to an appropriate wavelength of radiation. The radiation-sensitive resin in the '463 patent may be based on a condensate of an alkali-soluble resin such a novolac quinonediazide compound. The '463 patent describes a process in which selected areas of the photoresist are exposed to radiation and treated with a silicon-containing compound, which causes the silicon to incorporate into the resist layer, in the selected areas, by reaction with the acid.

A major problem with the techniques disclosed in the '008 and '463 patents is the poor-quality "hard" mask patterns which result from the disclosed methodologies. In both patents, the photoresist layer is exposed to radiation only in selected areas through a pre-applied mask. As a result, only selected areas are irradiated and processed to incorporate silicon into the resist composition. Unfortunately, the silicon dioxide pattern which results from such patterned irradiation turns out to be non-uniform in depth and composition, resulting in non-uniform edge lines. For example, in FIG. 3e of U.S. Pat. No. 4,882,008, a uniform-depth, thin layer of silicon dioxide 158 is illustrated as having been deposited precisely over the patterned area of photoresist 155. In reality, the silicon dioxide layer will turn out to be thick in the center and will taper to nothing at the side edges. That is believed to result from non-uniform incorporation of silicon into the photoresist through the mask openings. In other words, the pattern of silicon dioxide deposited is uneven, with substantial gradients in thickness. As a result, the silicon dioxide will have edge lines which thin to zero thickness, causing the edge lines on the mask pattern to be uneven and to have poor masking qualities. Consequently, fine etch lines cannot be made in the underlying resist.

Yet another tri-layer planarizing technique, representing a substantial advance in the tri-layer methodology, is disclosed in copending patent application Ser. No. 07/893,702, filed Jun. 5, 1992, entitled "Silylated Photoresist Layer and Planarizing Method," assigned to the same assignee as the present invention, of which the present application is a continuation-in-part. In application Ser. No. 07/893,702 a planarizing method and composition is disclosed which eliminates the need to use the defect-prone SOG material. Instead, the organic planarizing layer applied to the surface topography of a wafer substrate incorporates a suitable acid in its composition which allows, through careful processing, a blanket surface film of silicon dioxide to be formed in the planarizing layer. A photolithographic pattern is then formed in the film of silicon dioxide through application of a patterned imaging resist followed by suitable photolithographic etching steps. The silicon dioxide pattern is used as a mask for further processing of the planarizing resist. The present invention is a modification of the method and composition disclosed in application Ser. No. 07/893,702, the specification of which is incorporated herein by reference.

It would be advantageous to provide an alternative methodology for producing high-definition silicon dioxide mask patterns on the surface of a planarizing photoresist, without the disadvantages of using SOG.

It would also be advantageous to provide a simplified tri-layer planarizing technique which improves the sharpness of the mask pattern without the complexity and high defect densities of conventional prior art tri-layer techniques.

It would also be advantageous to provide a method for producing a mask pattern of silicon dioxide on the surface of a planarizing photoresist layer using a methodology which greatly improves the sharpness of the patterned edges over those produced by prior art methodologies.

Accordingly, the present invention provides a method of forming a mask pattern of silicon dioxide on the surface of a layer of photoresist. The steps in the method include irradiating the surface of the photoresist with a substantially uniform, unpatterned, shallow-penetrating radiation to create a substantially uniform, unpatterned, silicon-reactive region adjacent the surface of the photoresist. The next step is to softbake the irradiated photoresist in a silicon-containing environment to convert the silicon-reactive region to a silicon-enriched region adjacent the surface of the photoresist. The next step is to form a desired photolithographic pattern of imaging resist on the surface of the photoresist, overlying the silicon-enriched region. The next step is to form the photolithographic pattern in the silicon-enriched region of the photoresist using the imaging resist as a mask. The next step is to etch the resultant structure using an oxygen plasma to remove the imaging resist and convert the remaining portions of the silicon-enriched region to silicon dioxide. The result is a high-definition mask pattern of silicon dioxide on the surface of the photoresist.

In order accomplish the shallow-penetration irradiation step, the invention preferably employs radiation having a wavelength generally in the range of between 200-nanometers and 320-nanometers. The radiation will penetrate the surface of the photoresist to a depth of generally 3,000 Å or less. The preferred planarizing photoresist composition includes one or more polymers selected from the group consisting of a novolac, polymethylmephacrylate, polydimethylgluparimide, and a polyhydroxystyrene.

The method of the present invention can produce high-resolution patterns on a substrate. It preferably includes a preliminary step of applying the planarizing photoresist composition to the surface topography of the substrate. The irradiating and baking steps then follow the step of applying the planarizing photoresist. The step of forming the desired photolithographic patten of imaging resist more specifically includes coating the planarizing photoresist with a layer of imaging resist and then applying conventional photolithographic and etching steps to create the desired patten in the imaging resist. The step of forming the photolithographic patten in the silicon-enriched region preferably involves etching the planarizing photoresist using the imaging resist as a mask, with the etching being carried sufficiently far into the photoresist to remove the silicon-enriched layer near the surface in the selected areas being etched. The step of etching the resultant structure using an oxygen plasma accomplishes the removal of the imaging resist, and converts the silicon-enriched layer to silicon dioxide. It also removes the remaining planarizing photoresist in the regions defined by the photolithographic pattern, with the silicon dioxide serving as a mask. As a result, a high-definition photolithographic pattern is created on the planarizing photoresist topography of the substrate.

BRIEF DESCRIPTION OF THE DRAWINGS

The figures illustrate the steps in the preferred method of the present invention.

DETAILED DESCRIPTION OF THE PREFERRED EMBODIMENTS

Figure 1:
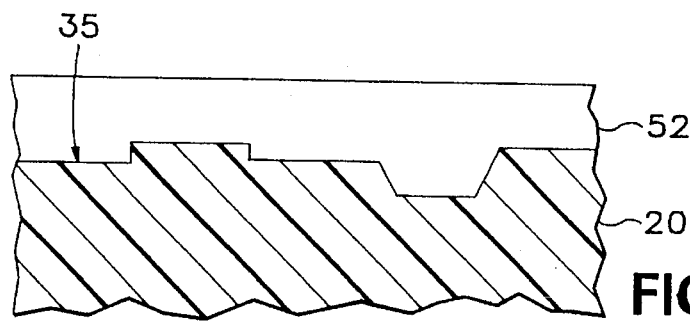
FIG. 1 is a cross-sectional view showing a representative surface topography to the etched, with a layer of planarizing photoresist applied over the topography.

The method of the present invention will be described with reference to FIGS. 1–7. In FIG. 1, a semiconductor substrate 20 is illustrated having a surface topography 35 on its upper horizontal surface. As shown, the surface topography includes features already formed on the substrate. How substrate 20 came to be configured in the manner shown forms no part of the present invention. It should be assumed that substrate 20 has received a certain amount of prior photolithographic, deposition, or other processing which created surface variations or added parts of semiconductor devices on the top of the substrate. This invention is particularly useful in the latter stages of integrated circuit device manufacturing, when precise high-definition photolithography is used to define the upper layers of the device. It is not limited to such applications, however, and may be used at other stages in device manufacturing. Consequently, the surface topography 35 depicted in FIG. 1 is intended to represent any of an infinite variety of topographies which can be processed by the methodology of the present invention.

A preliminary step in the methodology of the present invention is to apply a layer 52 of planarizing resist over the surface of topography 35 of substrate 20. Planarizing resist layer 52 is preferably a conventional photoresist made up of any suitable organic polymer used in lithographic processes, well known in the art, including conventional novolacs (or functionally similar polymers), polymides, polymethylmethacrylate ("PMMA"), polydimethylglutarimide ("PMGI"), or polyhydroxystyrene, alone or in combination with each other. It is preferred that the planarizing resist composition used in the present invention employ solvents that are relatively less evaporative than IPA for the dispersal of any sensitizes or other additives. Such solvents include ethyl lactate and propylene glycol monomethylether acetate (PGME). These solvents readily dissolve novolacs and other polymers suitable for use in connection with the invention, further contributing to the reduction of defect density in the planarizing layer.

Layer 52 has a thickness which exceeds the height of any topographic features on substrate 20. A high temperature bake step (not shown), to a temperature which exceeds the glass transition temperature of the photoresist polymer, is preferably applied to the planarizing photoresist 52 to produce appropriate coverage, flow and surface flatness. Planarizing photoresist layer 52 is alternatively referred to herein as a layer of photoresist, or as a first photoresist layer.

The aforementioned step shown in FIG. 1 is a preliminary step which is carried out as part of most conventional bi-layer and tri-layer planarizing techniques. It provides the base layer of photoresist on the substrate 20 which is ultimately used as a mask in further processing of the substrate.

Figure 2:
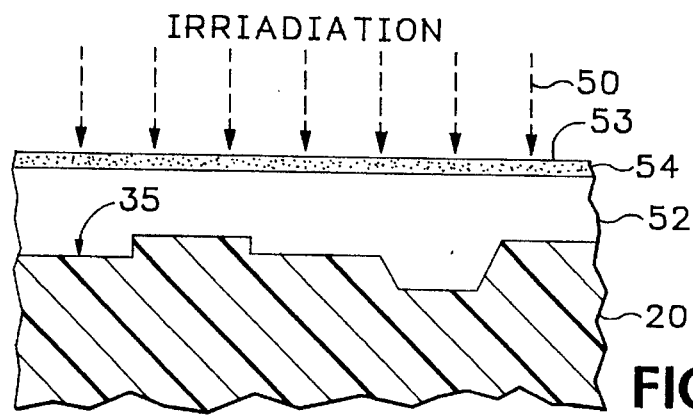
FIG. 2 illustrates the step of irradiating the surface of the photoresist with shallow-penetrating radiation.

The next step in the method of the present invention is illustrated in FIG. 2. In this step, the surface 53 of photoresist layer 52 is irradiated with shallow-penetration radiation 50 to create a silicon-reactive surface layer 54 in photoresist layer 52. The wavelength of the radiation is preferably generally in the range of between 200-nanometers and 320nanometers, which has been found to penetrate conventional organic polymer photoresists to a depth of not more than 3,000 Å below the surface 53 of the photoresist. The source (not shown) of the shallow-penetrating radiation 50 should provide a substantially uniform, unpatterned, equal distribution of radiation energy over the surface 53 of the photoresist 52. The incident radiation on the photoresist creates acid as a reaction product, as a result of well-known chemical processes. Consequently, the shallow-penetrating radiation produces a thin surface layer 54 of acid in solution with the photoresist, adjacent the surface 53 of the photoresist. Region 54 is referred to as a silicone-reactive region of the photoresist because the acid readily reacts with silicone.

Figure 3:
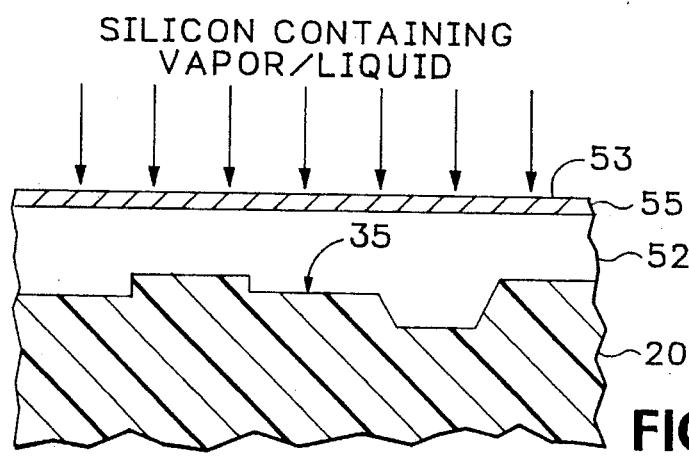
FIG. 3 illustrates the step of softbaking the irradiated photoresist in a silicon-containing environment.

The next step in the method is illustrated in FIG. 3. This step involves softbaking the irradiated photoresist in a silicon-containing environment. This step is also referred to as the softbake/silylation step. It is performed in a conventional vapor prime oven chamber such as the model available from Yield Enhancement Systems company. Any organosilane, such as hexamephyldisilazane amine ("HMDS") may be used as a silylating agent. Either liquid or gaseous organosilanes may be used, although the latter are easier to filter than the former and therefore contribute to the reduction of particulate formation in the planarizing layer. Use of a vapor prime oven and gaseous organosilane permits direct control of the vapor pressure, and thus controls the amount and uniformity of silicon incorporation.

A suitable methodology for performing the softbake/silylating step is to expose the irradiated planarizing resist 52 to the organosilane vapor for about one hour at 3 psi nitrogen and 170° C. Alternatively, ira hot plate oven is used, such as is commercially available from Silicon Valley Group, of San Jose, Calif., the planarizing resist may be exposed to organosilane vapor for about sixty seconds at 170° C. and 3 psi nitrogen carrier. A further alternative means for performing the softbake/silylating step is to apply a "puddle" or "pool" of liquid organosilanes directly on the planarizing resist for incorporation of the silicon into layer 54.

Figure 4:
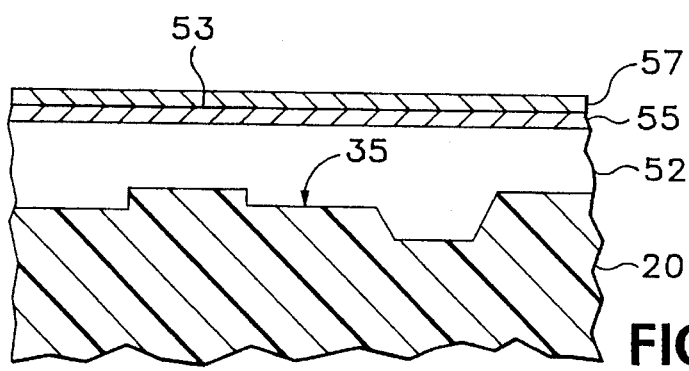
FIG. 4 illustrates the steps of applying a layer of imaging resist on the surface of the photoresist, over the top of the silicon-enriched region, adjacent the surface of the photoresist.

The softbake/silylation step results in the formation of a thin horizontal layer 55 of silicon-enriched photoresist in the upper portion of planarizing resist layer 52, as illustrated in FIGS. 3 and 4. The depth of silicon-enriched layer 55 will generally not exceed 3,000 Å, which is the depth of penetration of the shallow-penetration radiation 50, below the surface 53 of layer 52, in the irradiation step illustrated in FIG. 2. The concentration of silicon in layer 55 varies with depth, being less at greater depths. Consequently, silicon-enriched layer 55 does not end abruptly at a certain depth, but transitions gradually between layer 55 and the non-silicon-enriched remainder of photoresist layer 52. Silicon-enriched layer 55 is also referred to as a silicon-enriched plane adjacent the surface of planarizing photoresist layer 52, or is alternatively referred to the siliconenriched region of the photoresist.

The next step, illustrated in FIG. 4, is the coating of planarizing photoresist layer 52 with a thin layer of imaging resist 57. The imaging resist 57 is preferably made of any suitable imaging resist compound, well known to those skilled in the art. It is preferably spin-coated onto the surface 53 of planarizing resist 52, resulting in the layered structure shown in FIG. 4. The imaging resist 57 is preferably 2,000 Å to 4,000 Å in thickness and is conventionally softbaked and cured before proceeding to the next step. Imaging resist layer 57 is also referred to as the second photoresist layer.

Figure 5:
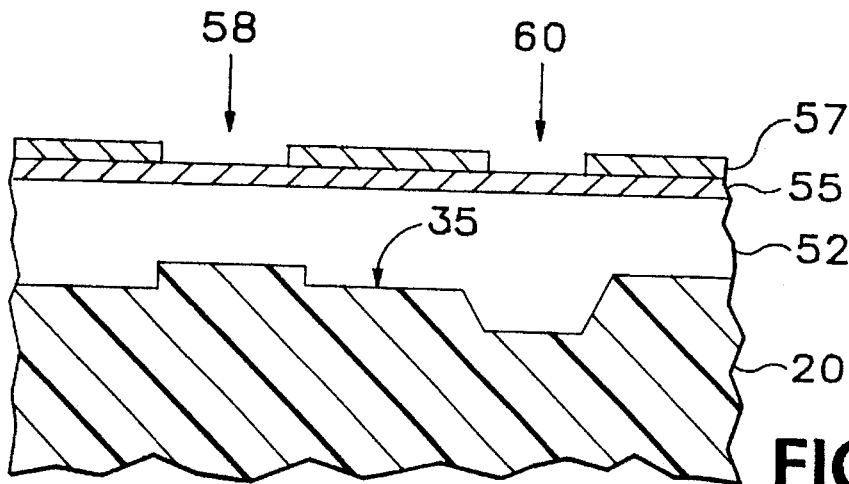
FIG. 5 shows the formation of a photolithographic pattern in the imaging resist.

FIG. 5 illustrates the step of forming a desired photolithographic pattern in the imaging resist 57. The pattern is alternatively referred to as the first photolithographic pattern. In the illustrated example, the photolithographic pattern consists of openings 58 and 60, which are formed in and extend through imaging resist layer 57. The pattern is formed by conventional photolithographic and etching steps such as, for example, exposing regions 58, 60 to light and developing the surface of the imaging resist to remove the resist from regions 58, 60.

Figure 6:
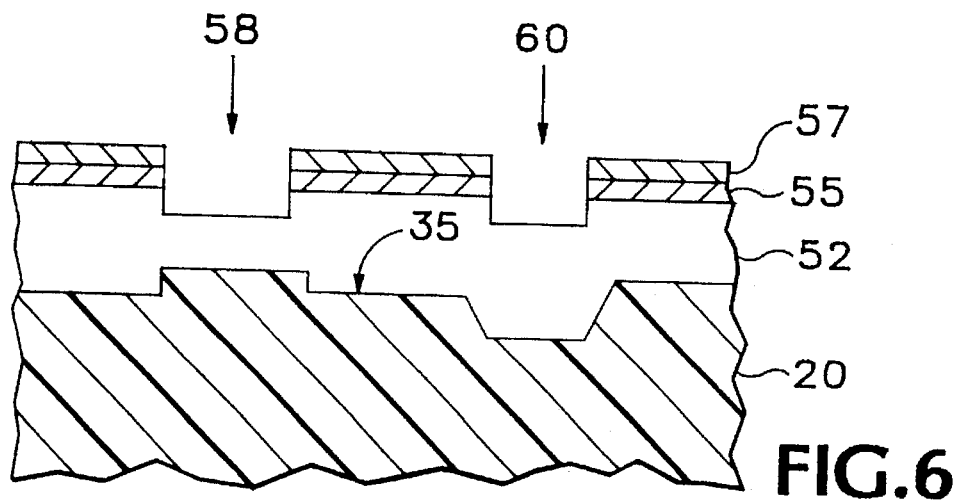
FIG. 6 illustrates the removal of portions of the planarizing resist, including the silicon-enriched region, using the imaging resist as a mask.

The next step, illustrated in FIG. 6, is to plasma etch down into planarizing resist layer 52 using imaging resist layer 57 as a mask. The plasma etch removes silicon-enriched layer 55 in the regions exposed to the plasma, namely regions 58, 60. This step is performed using conventional silicon dioxide etch processes, such as the use of a hyrdofluorocarbon gas, for example $CF_3H$ or $CF_4$. The etch forms (i.e., reproduces) the photolithographic pattern from imaging resist layer 57 in the silicon-enriched region 55 of photoresist layer 52. The etch may proceed into, but not through, photoresist layer 52, as illustrated in FIG. 6, or it may proceed through layer 52 to the surface topography 35 of substrate 20. It is only necessary that the etch extend through siliconenriched region 55.

Figure 7:
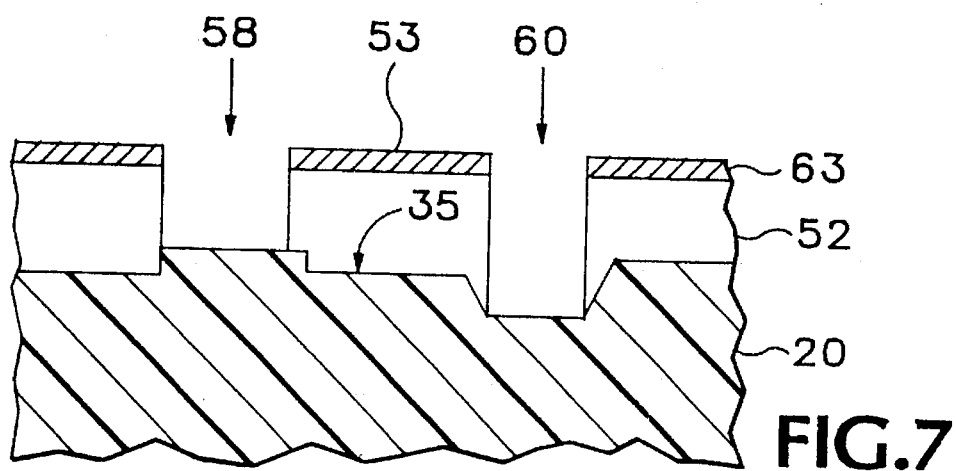
FIG. 7 illustrates the results of the exposure of the structure of FIG. 6 to an oxygen plasma, which removes the photoresist down to the topography of the substrate in the selected areas defined by the photolithographic pattern.

The next step, illustrated in FIG. 7, is to expose the resultant structure from the preceding step, shown in FIG. 6, to an oxidizing agent to convert the unremoved regions of the silicon-enriched layer 55 to a "hard" layer of silicon dioxide 63. That can be done immediately following the preceding step, and as part of the same plasma-etch process, by converting the etch plasma from a hyrdofluorocarbon gas to an oxidizing plasma, such as oxygen. The oxidizing plasma etch will remove the remaining portions of imaging resist layer 57 and will simultaneously convert the silicon-enriched layer 55 to $SiO_2$ (silicon dioxide) shown at 63 in FIG. 7. This step results in the formation of a photolithographic mask in the "hard" layer of silicon dioxide, at the surface of planarizing photoresist layer 52, which corresponds to the imaging layer mask shown in FIGS. 5 and 6. The silicon dioxide acts as a mask during the oxidizing plasma etching step and produces high-resolution etch lines in the planarizing resist. The oxidizing plasma etch also removes any remaining portions of planarizing photoresist layer 52 in the pattern opening areas 58, 60, thus exposing the topography of substrate 20 in those selected regions.

Unlike prior art systems for irradiating and converting surface layers of planarizing resist to silicon dioxide, as disclosed in U.S. Pat. Nos. 4,882,008 and 4,963,463, the entire surface of resist layer 52 is first blanketed with a silicon-enriched region (see FIG. 4), and then that surface silicon-enriched region is etched to form the desired pattern. As a result, the silicon dioxide layer has a generally uniform thickness or depth, even at the edges of the pattern, and produces sharp, precise patten edge lines. The present invention avoids the problem of tapered edge gradients along the pattern edges which result from the processes disclosed in the '008 and '463 patents. It is a feature of the present invention that the irradiation step described with reference to FIG. 2 uses radiation applied generally uniformly over the surface topography of the substrate, and not just in selected patterned regions. Accordingly, in its preferred form, the irradiation step includes irradiating the surface of the photoresist with substantially uniform, unpatterned, shallow-penetration radiation to create a substantially uniform, unpatterned, silicon-reactive region adjacent the surface of the photoresist. The result is a siliconreactive region which blankets large areas of the surface of the photoresist layer and extends broadly over the topography of the substrate. It is the broad silicon-enriched layer in the photoresist which is subsequently patterned and etched to create high-definition silicondioxide masks of the type shown in FIG. 7.

With the bi-layer process of the present invention, the essence of the tri-layer process is duplicated without the difficulties of using SOG material. The thin silylated layer on the planarizing resist functions similarly to SOG material, but is much simpler to form, with fewer defects. Yet the silylated layer 55 (in FIGS. 4–6) has the benefits of SOG in that it is readily patterned using the thin imaging resist layer to generate sharp positive and negative transitions. The result of the present invention is the transfer of desirably sharp patterns to the wafer substrate 20, facilitating the production of low defect high-density integrated circuit devices. Moreover, the process of the present invention provides enhanced process capabilities using conventional organic resists.

What is claimed is:

1. A method of forming a mask pattern of silicon dioxide on the surface of a layer of photoresist, the method comprising the steps of:

(a) forming a uniform, unpatterned, silicon-reactive region in a surface region of the photoresist by irradiating the surface of the photoresist with uniform, unpatterned, radiation that reaches the surface without passing through a mask and which penetrates not more than 3,000 Å below the surface of the photoresist;

(b) softbaking the irradiated photoresist in a silicon-containing environment to convert said silicon-reactive region to a silicon e enriched region which extends below the surface of the photoresist to a depth determined by the penetration of the radiation in step (a);

(c) applying a second photoresist layer over the softbaked irradiated photoresist from step (b);

(d) forming a desired photolithographic pattern of imaging resist on the surface of the second photoresist layer (e) forming said photolithographic pattern in said siliconenriched region of the photoresist using the imaging resist as a mask; and (f) etching the resultant structure using an oxygen plasma to remove the imaging resist and convert the remaining portions of said silicon-enriched region to silicon dioxide.

2. A method as in claim 1 in which the radiation used in step (a) has a wavelength in the range of approximately 200- to 320- nanometers.

3. A photolithography method for creating high-resolution patterns on a substrate, the method comprising the steps of:

(a) applying a planarizing photoresist composition to the surface topography of the substrate;

(b) forming a uniform, unpatterned, silicon-reactive region in a surface region of the planarizing photoresist by irradiating the surface of the photoresist with radiation that penetrates not more than 3,000 Å below the surface of the photoresist, wherein the radiation reaches the surface without passing through a mask to create a silicon-reactive surface layer in the planarizing photoresist extending over the substrate;

(c) softbaking the irradiated planarizing photoresist in a silicon-containing environment to produce a silicon-enriched surface layer in the planarizing photoresist extending over the substrate;

(d) coating the planarizing photoresist with a layer of imaging resist extending over the substrate;

(e) forming a first photolithographic pattern in the imaging resist layer;

(f) employing photolithographic techniques to etch the planarizing photoresist in selected areas defined by said first photolithographic pattern formed in the imaging resist to remove the silicon-enriched layer in said selected areas; and (g) exposing the remainder of the planarizing photoresist to an oxidizing agent to convert the silicon-enriched surface layer to $SiO_2$, thereby producing a desired pattern of $SiO_2$ on the surface of the planarizing photoresist.

4. A photolithography method as in claim 3 in which the planarizing photoresist composition includes one or more polymers selected from the group consisting of a novolac, polymethylmethacrylate, polydimethylglutarimide, and polyhydroxystyrene.

5. A photolithography method as in claim 3 in which step (g) also removes the imaging resist.

6. A photolithography method as in claim 3 in which step (g) includes etching the planarizing photoresist in said selected areas using an oxidizing plasma to convert the silicon-enriched surface layer to $SiO_2$, permitting the $SiO_2$ to act as a mask for etching the planarizing photoresist, and causing the oxidizing plasma to etch the remaining planarizing photoresist in said selected areas to expose the surface topography of the substrate.

7. A photolithography method as in claim 3 in which the radiation used in step (b) has a wavelength in the range of approximately 200- to 320- nanometers.

8. A photolithography method as in claim 3 in which step (c) further includes softbaking the planarizing photoresist in the presence of a liquid or gaseous organosilane to produce said silicon-enriched surface layer.

9. A method of forming a pattern of silylated planarizing resist extending over the surface topography of an integrated circuit substrate to serve as a photolithographic mask, the method comprising the steps of:

(a) applying a first photoresist layer over the surface topography of the substrate;

(b) irradiating the surface of the first photoresist layer with unpatterned radiation which reaches the surface without passing through a mask, the radiation having a wavelength which penetrates not more than 3,000 Å below the surface of the photoresist to produce a shallow, uniform surface layer of acid within the photoresist in a plane adjacent the surface of the photoresist;

(c) exposing the irradiated first photoresist layer to a silicon-containing environment, whereby the silicon reacts with the acid in said shallow, uniform surface layer to produce a silicon-enriched surface layer within the first photoresist layer;

(d) applying a second photoresist layer over said first photoresist layer;

(e) forming a photolithographic pattern in the second photoresist layer;

(f) using the second photoresist layer as a mask, removing said silicon-enriched surface layer within the first photoresist layer in the regions corresponding to said photolithographic pattern; and (g) exposing the resultant structure to an oxidizing agent to convert the unremoved regions of the silicon-enriched surface layer within the first photoresist layer to silicon dioxide, thereby reproducing said photolithographic pattern in the silicon dioxide.

10. A method as in claim 9 in which step (f) includes removing a majority of the first photoresist layer in the regions corresponding to said photolithographic pattern, including said silicon-enriched surface layer.

11. A method as in claim 9 in which the radiation used in step (b) has a wavelength in the range of approximately 200- to 320- nanometers.

12. A method as in claim 9 in which the first photoresist layer is a composition which includes one or more polymers selected from the group consisting of a novolac, polymethylmethacrylate, polydimethylglutarimide, and polyhydroxystyrene.

13. A method as in claim 9 in which step (g) includes etching the resultant structure using an oxygen plasma, with the silicon dioxide acting as a mask, to remove the second photoresist layer and to remove the remaining portions of the first photoresist layer, thereby exposing the topography of the substrate in the regions corresponding to said photolithographic pattern.

14. A method as in claim 9 in which step (g) also removes the second photoresist layer.

15. A method as in claim 9 in which step (c) further includes softbaking the first photoresist layer in the presence of a liquid or gaseous organosilane to produce said silicon-enriched surface layer.

* * * * *